(12) United States Patent
Iida et al.

(10) Patent No.: US 11,621,705 B2
(45) Date of Patent: Apr. 4, 2023

(54) SEMICONDUCTOR INTEGRATED CIRCUIT DEVICE AND LEVEL SHIFTER CIRCUIT

(71) Applicant: SOCIONEXT INC., Kanagawa (JP)

(72) Inventors: Masahisa Iida, Yokohama (JP); Masahiro Gion, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 205 days.

(21) Appl. No.: 17/122,737

(22) Filed: Dec. 15, 2020

(65) Prior Publication Data

US 2021/0105009 A1 Apr. 8, 2021

Related U.S. Application Data

(63) Continuation of application No. PCT/JP2018/023232, filed on Jun. 19, 2018.

(51) Int. Cl.
*H03K 3/356* (2006.01)
*H03K 19/003* (2006.01)
*H03K 19/0185* (2006.01)

(52) U.S. Cl.
CPC . *H03K 3/356017* (2013.01); *H03K 19/00315* (2013.01); *H03K 19/018507* (2013.01)

(58) Field of Classification Search
CPC ..... H03K 3/356113; H03K 19/018521; H03K 17/063; H03K 17/06; H03K 17/00; H03K 3/356104; H03K 3/356; H03K 3/353; H03K 3/02; H03K 3/00; H03K 19/00315; H03K 19/003; H03K 19/00; H03K 3/35613; H03K 3/36
See application file for complete search history.

(56) References Cited

U.S. PATENT DOCUMENTS

| 6,064,227 | A | 5/2000 | Saito |
| 10,305,474 | B2 * | 5/2019 | Lee ................. H03K 19/00315 |
| 2004/0124879 | A1 | 7/2004 | Narwal |

(Continued)

FOREIGN PATENT DOCUMENTS

| JP | H06-152383 A | 5/1994 |
| JP | H09-116416 A | 5/1997 |

(Continued)

OTHER PUBLICATIONS

Notice of Reasons for Refusal dated Mar. 1, 2022 issued in the corresponding Japanese Patent Application No. 2020-525110, with English translation.

(Continued)

*Primary Examiner* — Diana J. Cheng
(74) *Attorney, Agent, or Firm* — McDermott Will & Emery LLP

(57) ABSTRACT

A semiconductor integrated circuit device includes: first and second transistors provided between a first power source and an output terminal; a step-down circuit that generates a second power source from the first power source; a power source switch circuit that outputs, as a fourth power source, a higher one of potentials of the second power source and a third power source; and a level shifter circuit that transits between the first power source and a fourth power source. The first transistor has a gate connected to an output of the level shifter circuit; the second transistor has a gate connected to the fourth power source.

4 Claims, 10 Drawing Sheets

(56) References Cited

U.S. PATENT DOCUMENTS

| | | |
|---|---|---|
| 2004/0140841 A1 | 7/2004 | Mitarashi |
| 2004/0207450 A1 | 10/2004 | Ando |
| 2006/0044041 A1 | 3/2006 | Andresen et al. |
| 2013/0222038 A1 | 8/2013 | Kuge |
| 2015/0171858 A1 | 6/2015 | Matsuoka et al. |
| 2021/0409019 A1* | 12/2021 | Lee .................. H03K 17/6872 |

FOREIGN PATENT DOCUMENTS

| | | |
|---|---|---|
| JP | H09-172368 A | 6/1997 |
| JP | H10-294662 A | 11/1998 |
| JP | 2000-068811 A | 3/2000 |
| JP | 2004-228782 A | 8/2004 |
| JP | 2004-260242 A | 9/2004 |
| JP | 2006-101490 A | 4/2006 |
| JP | 2007-060201 A | 3/2007 |
| JP | 2013-211817 A | 10/2013 |
| JP | 2013-219669 A | 10/2013 |
| JP | WO2014/038115 A1 | 3/2014 |

OTHER PUBLICATIONS

International Search Report and Written Opinion issued in International Patent Application No. PCT/JP2018/023232, dated Sep. 18, 2018; with partial English translation.

* cited by examiner

SEMICONDUCTOR INTEGRATED CIRCUIT DEVICE AND LEVEL SHIFTER CIRCUIT

CROSS-REFERENCE TO RELATED APPLICATIONS

This is a continuation of International Application No. PCT/JP2018/023232 filed on Jun. 19, 2018. The entire disclosures of these applications are incorporated by reference herein.

BACKGROUND

The present disclosure relates to a semiconductor integrated circuit device that outputs an output signal in accordance with an input signal.

In a semiconductor integrated circuit device, an interface circuit for inputting and outputting a signal from and to an external device is required to operate at a high speed with low power consumption. In order to achieve such high-speed operation and low power consumption, transistors operable at a low voltage, such as 1.8 V, are used as input/output (IO) transistors. On the other hand, an interface circuit needs to receive and output a high-voltage signal of 3.3 V, for example.

Japanese Unexamined Patent Publication No. 2007-60201 discloses a technique for constituting an output circuit that outputs a high-voltage signal to the outside by using transistors operable at a low voltage. In this technique, the low-voltage transistor is connected in a cascade between a high-voltage power source and an output pad to relieve a source-drain voltage of the low-voltage transistor. A p-type transistor driving an output signal has (i) a source connected to the high-voltage power source, (ii) a drain connected to the output pad via another transistor, and (iii) a gate provided with a signal transiting between a high voltage and a low voltage. Furthermore, a gate of the other transistor is connected to a voltage source (hereinafter referred to as a low-voltage power source) lower than the high-voltage power source so that the voltage applied to each transistor does not exceed the withstand voltage. In the circuit of Japanese Unexamined Patent Publication No. 2007-60201, however, when both the low-voltage power source and high-voltage power source rise, if the high-voltage power source has risen earlier than the low-voltage power source, a withstand voltage violation occurs in transistors and some of those transistors may be disadvantageously damaged.

In a signal voltage level conversion circuit of Japanese Unexamined Patent Publication No. H06-152383, a voltage of a high-voltage power source is step down and then supplied to a low-voltage power source side. Thus, even when the high-voltage power source has already risen but a low-voltage power source does not yet rise, a withstand voltage violation does not occur.

SUMMARY

The configuration of Japanese Unexamined Patent Publication No. 2007-60201 has a disadvantage in that, when the high-voltage power source has already risen but the low-voltage power source does not yet rise, an unnecessary current may flow from the high-voltage power source via the low-voltage power source and a circuit connected to a site after the low-voltage power source to the ground.

It is an object of the present disclosure is to provide a circuit in which, even if a high-voltage power source has risen earlier than a low-voltage power source, no withstand voltage violation occurs and no unnecessary current as described above flows.

According to a first aspect of the present disclosure, a semiconductor integrated circuit device receives a data input signal and outputs an output signal that varies in accordance with the data input signal. The semiconductor integrated circuit device includes: an output terminal via which the output signal is output; a first transistor of a p type having a source connected to a first power source; a second transistor of a p type having a source connected to a drain of the first transistor and a drain connected to the output terminal; a step-down circuit that generates a second power source from the first power source; a power source switch circuit that outputs, as a fourth power source, a higher one of potentials of the second power source and a third power source, the power source switch circuit including a third transistor connected to the second power source and a fourth transistor connected to the third power source; and a first level shifter circuit that transits between the first power source and the fourth power source. The first transistor has a gate connected to an output of the first level shifter circuit; the second transistor has a gate connected to the fourth power source.

In this aspect, a higher one of the potentials of the second power source, which has been generated from the first power source, and the third power source is output as the fourth power source. Furthermore, the gate of the first transistor with its source connected to the first power source is connected to the output of the first level shifter circuit that transits between the first power source and the fourth power source. The gate of the second transistor with the source connected to the drain of the first transistor is connected to the fourth power source. Thus, the aspect makes it possible to provide a semiconductor integrated circuit in which no withstand voltage violation occurs independently of an order in which the first power source and the third power source rises.

The present disclosure can provide a semiconductor integrated circuit device in which, even if a high-voltage power source has risen earlier than a low-voltage power source, no withstand voltage violation occurs and no unnecessary current flows.

DETAILED DESCRIPTION

Embodiments will be described in detail with reference to the drawings. Note that the circuit diagrams below are simplified, mainly illustrating constituent elements of the present disclosure. Hence, illustrated constituent elements seemingly make a direct connection with each other. In an actual circuit configuration, however, these elements may be connected indirectly with each other because there may be another constituent element provided between the elements. Each transistor described below may be a metal oxide semiconductor field effect transistor (MOSFET).

First Embodiment

Figure 1:
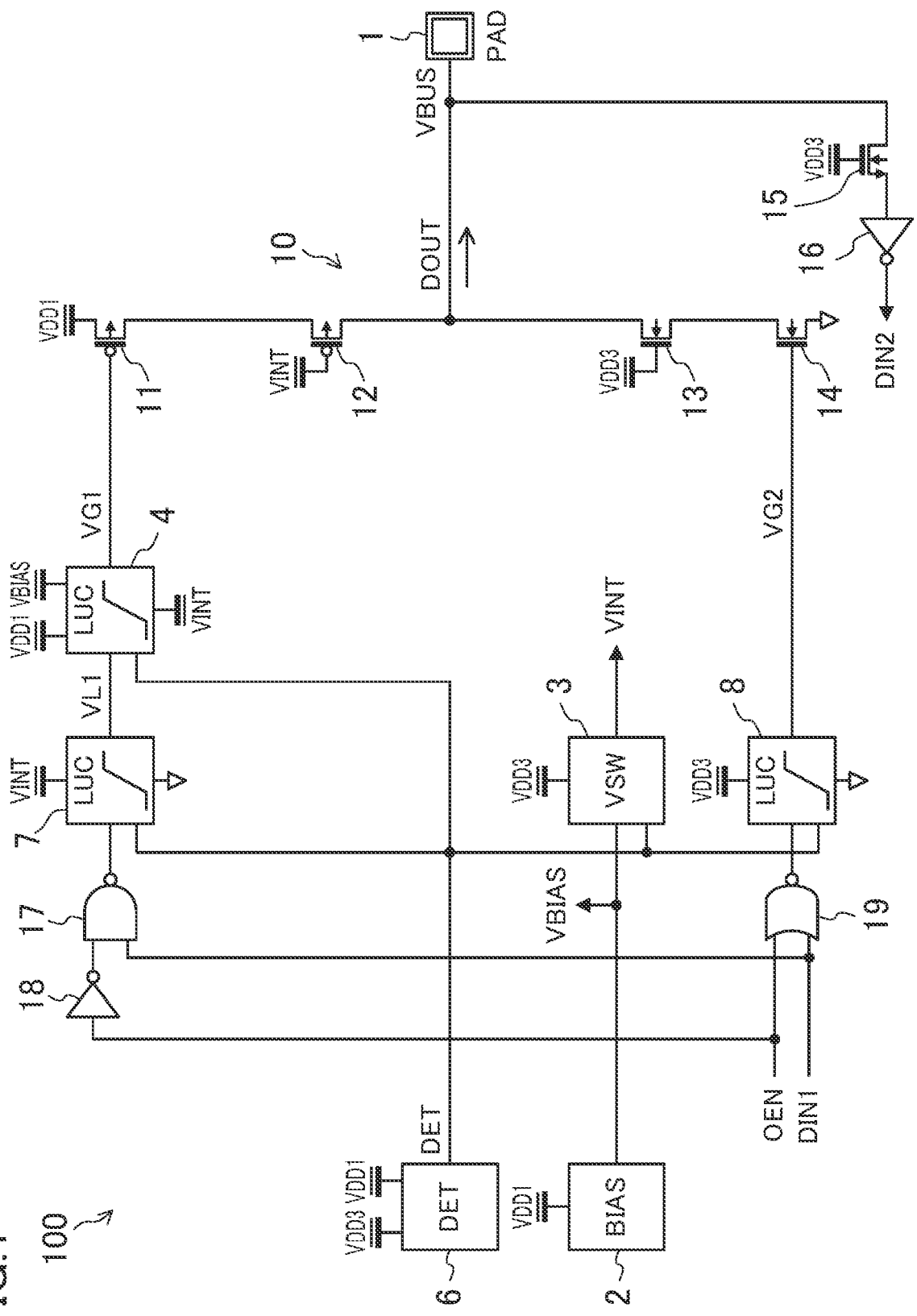
FIG. 1 is a circuit configuration diagram of a semiconductor integrated circuit device according to a first embodiment.

FIG. 1 is a circuit configuration diagram of a semiconductor integrated circuit device according to a first embodiment. A semiconductor integrated circuit device 100 of FIG. 1 receives a data input signal DIN1 and outputs an output signal DOUT that varies in accordance with the data input signal DIN1. The output signal DOUT is output from an output terminal 1. The semiconductor integrated circuit device 100 may be provided, for example, in a signal input/output section of a large-scale integrated (LSI) circuit. For example, the output terminal 1 may correspond to an input/output pad or an output pad of the LSI.

The semiconductor integrated circuit device 100 is connected to a first power source VDD1 and a third power source VDD3. Herein, each of the "VDD1" and "VDD3" is used as a symbol representing both a power source itself and a potential given by the power source. Similarly, "VDD2", "VDD4", and "GND", which will be described later, are also each used as a symbol representing both a power source itself and a potential given by the power source.

The first potential VDD1 differs from the third potential VDD3 during a regular operation of the semiconductor integrated circuit device 100. In the following description, for convenience of explanation, the third potential VDD3 is set to be lower than the first potential VDD1. For example, the first potential VDD1 may be set to 3.3 V and the third potential VDD3 may be set to 1.8 V. In the present embodiment, a state in which a predetermined constant potential is applied from each power source is referred to as a regular operation.

The data input signal DIN1 is a low-amplitude signal that transitions between a ground potential GND and 0.9 V, for example. The output signal DOUT transits between the ground potential GND and the first potential VDD1.

As illustrated in FIG. 1, the semiconductor integrated circuit device 100 includes: p-type transistors 11 and 12 connected together in series between the first power source VDD1 and the output terminal 1; a bias generation circuit 2 that acts as a step-down circuit; a power source switch circuit 3; and a level shifter circuit device 4. A gate of the p-type transistor 11 is connected to an output VG1 of the level shifter circuit device 4; a gate of the p-type transistor 12 is connected to a fourth power source VINT. The p-type transistor 11 acts as a first transistor, whereas the p-type transistor 12 acts as a second transistor. A withstand voltage of each of the p-type transistors 11 and 12 is the third potential VDD3.

The bias generation circuit 2 steps down the first power source VDD1 to generate a second power source VBIAS. In the following description, for convenience of explanation, the second potential VBIAS is set to be lower than both the first potential VDD1 and the third potential VDD3 during the regular operation of the semiconductor integrated circuit device 100. For example, the second potential VBIAS may be set to 1.65 V.

The power source switch circuit 3 outputs, as a fourth power source VINT, a higher one of the potentials of the third power source VDD3 and the second power source VBIAS generated by the bias generation circuit 2.

Connected together in series between the output terminal 1 and the ground GND are n-type transistors 13 and 14. A withstand voltage of each of the n-type transistors 13 and 14 is equal to the third potential VDD3. The n-type transistor 13 acts as a fifth transistor.

The p-type transistors 11 and 12 and the n-type transistors 13 and 14 are connected together in series in this order between the first power source VDD1 and the ground GND to constitute an output section 10. A node at which a drain of the p-type transistor 12 is connected to a drain of the n-type transistor 13 is connected to the output terminal 1. A gate of the n-type transistor 13 is connected to the third power source VDD3, whereas a gate of the n-type transistor 14 is connected to a level shifter circuit 8 that will be described later.

The output terminal 1 may also function as an input/output terminal. For example, in FIG. 1, the output terminal 1 is connected to an inverter 16 via an n-type transistor 15 with its gate connected to the third power source VDD3. The output terminal 1 transmits a data input signal DIN2 to an interior of the semiconductor integrated circuit device 100. The output terminal 1 functions as an input terminal.

For example, when an output enable signal OEN is at a low level, the semiconductor integrated circuit device 100 outputs the output signal DOUT that varies in accordance with the data input signal DIN1, via the output terminal 1. When the output enable signal OEN is at a high level, the semiconductor integrated circuit device 100 is in a state of receiving a signal from an external device (not illustrated) via the output terminal 1.

As illustrated in FIG. 1, the output enable signal OEN is input to one input terminal of a NAND circuit 17 via an inverter 18. The data input signal DIN1 is given to the other input terminal of the NAND circuit 17. An output node of the NAND circuit 17 is connected to a level shifter circuit 7.

The level shifter circuit 7 converts an input signal that transits between the ground potential GND and a voltage level of a core power source (e.g., 0.9 V) into an output signal VL1 that transits between the ground potential GND and a fourth potential VINT. Then, the level shifter circuit 7 outputs the output signal OUT to the level shifter circuit device 4.

The level shifter circuit device 4 receives an output DET of a power source detection circuit 6 that will be described later and an output VL1 of the level shifter circuit 7 that will be described later. Then, the level shifter circuit device 4 outputs a signal VG that transits between the fourth potential VINT and the first potential VDD1 to the gate of the p-type transistor 11.

Both the output enable signal OEN and the data input signal DIN1 are input to the level shifter circuit 8 via a NOR circuit 19.

The level shifter circuit 8 converts an input signal that transits between the ground potential GND and the voltage level of the core power source (e.g., 0.9 V) into an output signal VG2 that transits between the ground potential GND and the third potential VDD3. Then, the level shifter circuit 8 outputs the output signal VG2 to the gate of the n-type transistor 14.

As described in the background art, in order to ensure the withstand voltages in the configuration of Japanese Unexamined Patent Publication No. 2007-60201, there is a limitation that the high-voltage power source cannot rise earlier. This is because, when the high-voltage power source has risen earlier, a voltage exceeding the withstand voltage may be applied to transistors at the output stage. In contrast, the semiconductor integrated circuit device 100 according to the present disclosure is configured such that the withstand voltage violation does not occur even if the high-voltage power source has risen earlier.

With reference to the drawings, a specific description will be given below. The following description will be given of the circuit operation in the case where the first power source VDD1 has risen earlier. The description of the operation in the case where the third power source VDD3 has risen earlier may be omitted. This is because, when the third power source VDD3 has risen earlier, the semiconductor integrated circuit device 100 according to the present disclosure operates properly without causing a withstand voltage violation, but also the withstand voltage violation does not occur in the prior art in this case.

Figure 2:
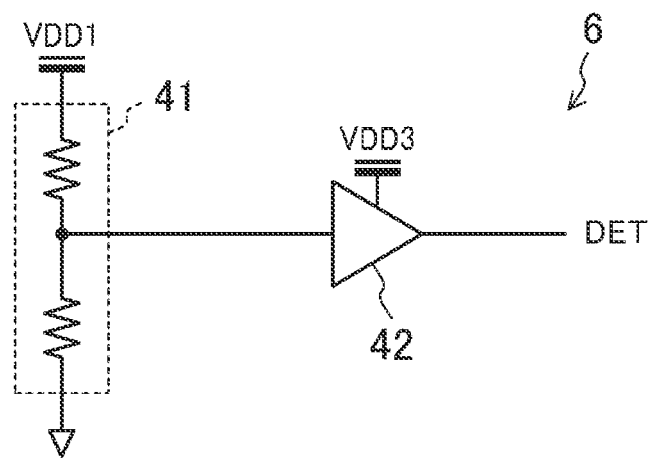
FIG. 2 is a circuit configuration diagram of a power source detection circuit.

As illustrated in FIG. 2, the power source detection circuit 6 is a circuit that outputs a high-level signal when detecting that the first power source VDD1 and the third power source VDD3 have reached predetermined constant potentials. More specifically, the power source detection circuit 6 includes: a resistance voltage divider circuit 41 and a buffer 42 connected to a downstream-stage of the resistance voltage divider circuit 41. The resistance voltage divider circuit 41 generates an intermediate potential of the first power source VDD1. The buffer 42 is supplied with the third power source VDD3. This intermediate potential is set to a potential by which the output DET of the buffer 42 is switched to a high level when the first potential VDD1 is given to the first power source VDD1 and the third potential VDD3 is given to the third power source VDD3. More specifically, the output DET of the power source detection circuit 6 becomes at the high level during the regular operation. The output DET is at the low level when the first power source VDD1 has already risen but the third power source VDD3 does not yet rise in a power source startup sequence (referred to below as a power source sequence). Herein, the buffer 42 that can employ a configuration of the prior art and thus will not be described in detail.

Figure 3A:
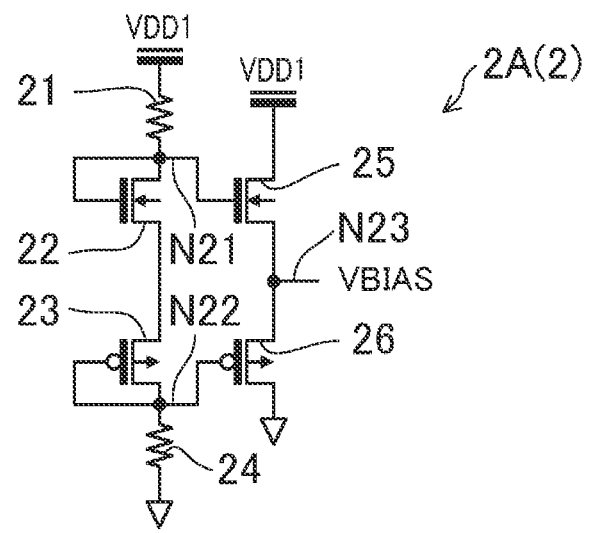
FIG. 3A is a circuit configuration diagram of a bias generation circuit.
Figure 3B:
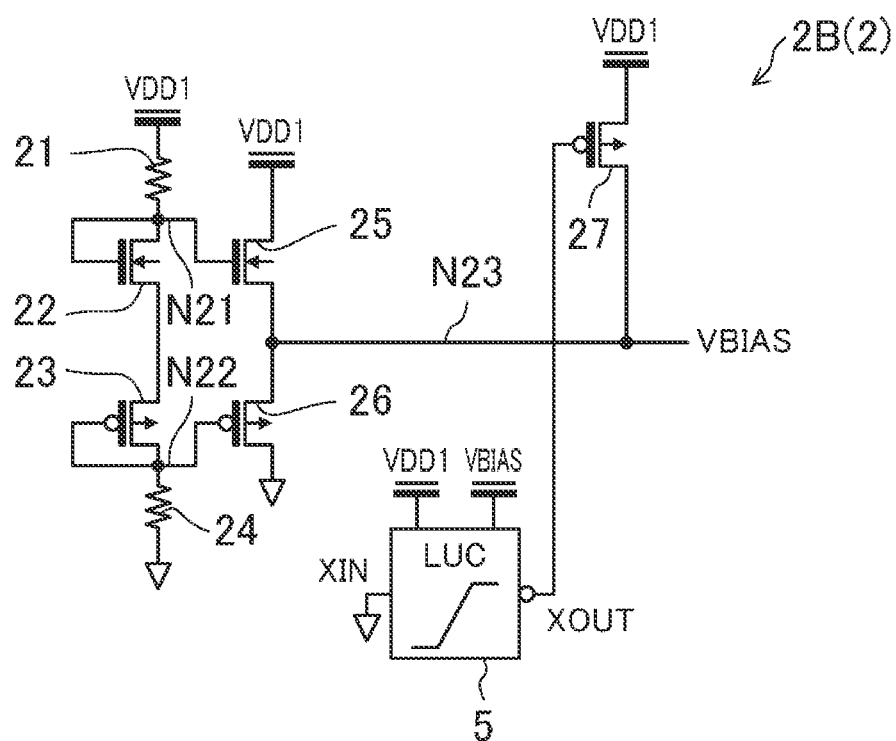
FIG. 3B is a circuit configuration diagram of another example of the bias generation circuit.

FIGS. 3A and 3B are configuration examples of the bias generation circuit 2.

FIG. 3A illustrates a push-pull type of bias circuit, which has a two-stage configuration of an upstream-stage circuit and a downstream-stage circuit. In the bias generation circuit 2A of FIG. 3A, the upstream-stage circuit includes a resistance element 21, an n-type transistor 22, a p-type transistor 23, and a resistance element 24, all of which are connected together in series in this order between the first power source VDD1 and the ground GND. The downstream-stage circuit includes an n-type transistor 25 and a p-type transistor 26, both of which are connected together in series between the first power source VDD1 and the ground GND. In the upstream circuit, a gate and drain of the n-type transistor 22 are connected together at a connection node N21, which is connected to a gate of the n-type transistor 25 in the upstream-stage circuit. Similarly, in the upstream-stage circuit, a gate and drain of the p-type transistor 23 are connected together at a connection node N22, which is connected to a gate of the p-type transistor 26 in the downstream-stage circuit.

For example, in the bias generation circuit 2 of FIG. 3A, (1) the resistance values of the two resistance elements 21 and 24 in the upstream circuit are set to the same resistance value; (2) drive capabilities (on resistances) of the n-type transistor 22 and the p-type transistor 23 in the upstream-stage circuit are set equally; and (3) drive capabilities (on resistances) of the n-type transistor 25 and p-type transistor 26 in the downstream-stage circuit are set equally. With this configuration, the bias generation circuit 2 can output a voltage that is approximately half the first potential VDD1.

The bias generation circuit 2B of FIG. 3B includes, in addition to the bias generation circuit 2A of FIG. 3A, a p-type transistor 27 for pull-up usage using the first power source VDD1, at the output node N23 of the bias generation circuit 2A. A gate of the p-type transistor 27 is connected to a level shifter circuit device 5. The level shifter circuit device 5 has an input XIN connected to the ground GND.

The level shifter circuit device 5 is a circuit that outputs a low-level signal as an output signal XOUT in the power source sequence and, in turn, outputs a high-level signal as the output signal XOUT during the regular operation. In short, the bias generation circuit 2B supplies a current from the first power source VDD1 to the output node N23 via the p-type transistor 27 in the power source sequence. This can improve the rising characteristics of the second power source VBIAS, because the second power source VBIAS rises in response to a rising potential of the first power source VDD1. The level shifter circuit device 4 (see FIG. 1) thereby can be set promptly and reliably to a desired initial logic in the power source sequence. Furthermore, during the regular operation, the level shifter circuit device 5 outputs a high-level signal as the output signal XOUT, thereby turning off the p-type transistor 27 to reduce an influence on the output of the second power source VBIAS.

Figure 3C:
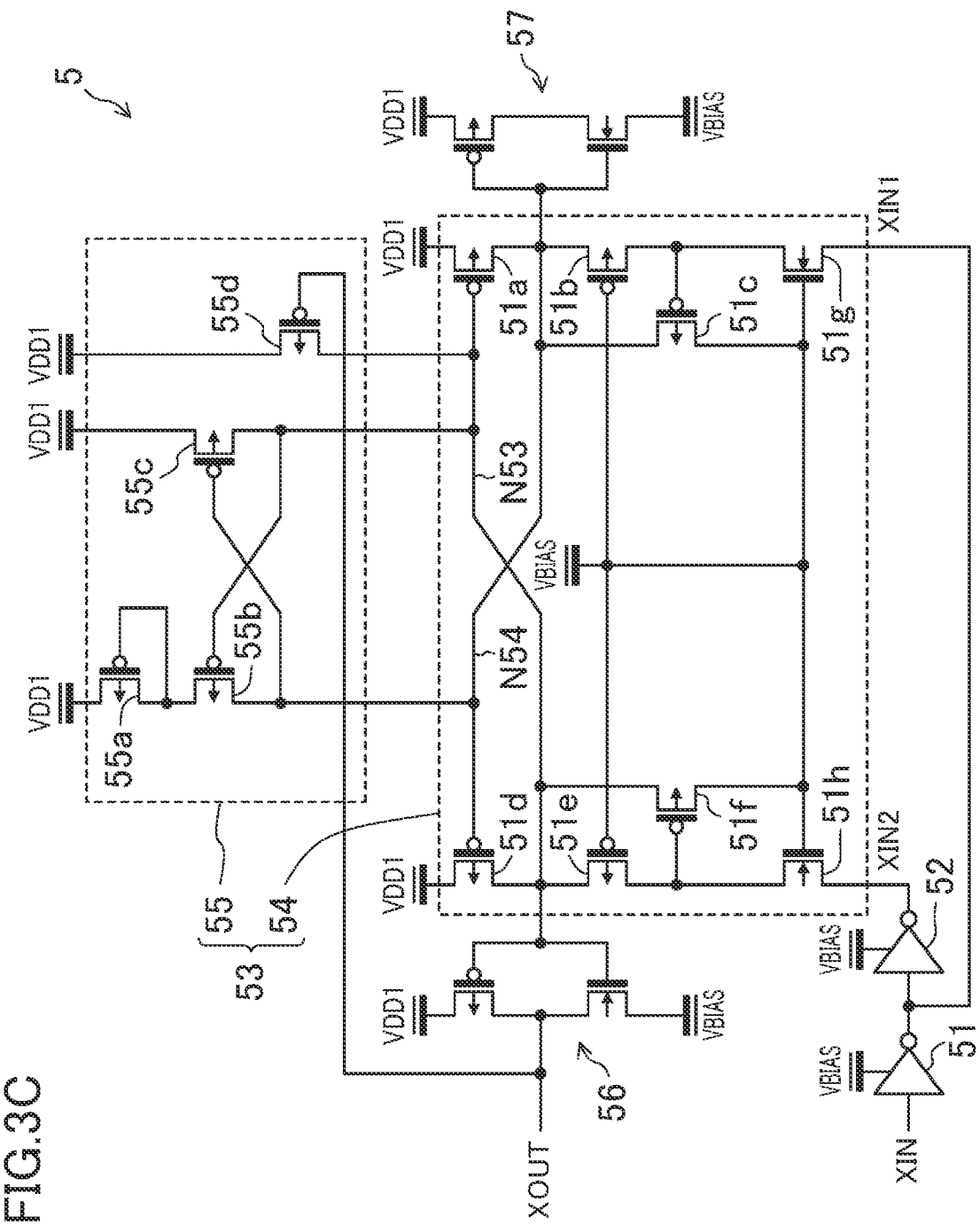
FIG. 3C is a circuit configuration diagram of a level shifter circuit device.

FIG. 3C illustrates a configuration example of the level shifter circuit device 5.

As illustrated in FIG. 3C, the level shifter circuit device 5 includes: a first input inverter 51 and a second input inverter 52 connected together in series, a level shifter circuit 53; and an output inverter 56 connected between the first potential VDD1 and the second potential VBIAS.

The first input inverter 51 inverts the input signal XIN to generate a first input signal XIN1 that transits between the ground potential GND and the second potential VBIAS. The second input inverter 52 receives the output of the first input inverter 51 and generates a second input signal XIN2 that transits between the ground potential GND and the second potential VBIAS. In the present embodiment, since the input XIN of the level shifter circuit device 5 is connected to the ground GND, the first input inverter 51 outputs a high-level signal as the first input signal XIN1, and the second input inverter 52 outputs a low-level signal as the second input signal XIN2. Herein, "XIN1", "XIN2", and "XOUT" that will be described later are each used as a symbol representing both a signal itself and a node to which the signal is transmitted. The same is applied to another signal and a node to which the signal is transmitted.

The level shifter circuit 53 has a function of converting a signal that transits between the ground potential GND and the second potential VBIAS into a signal that transits between the second potential VBIAS and the first potential VDD1, during the regular operation.

The level shifter circuit 53 includes a converter 54 and an initial setting section 55. The converter 54 includes six p-type transistors 51a to 51f and two n-type transistors 51g and 51h, and the initial setting section 55 sets an output of the level shifter circuit 53 to a predetermined output in the power source sequence.

In the converter 54, the p-type transistor 51a, the p-type transistor 51b, and the n-type transistor 51g, which act as, respectively, first, second, and third transistors, are connected together in series between the first power source VDD1 and the first input node XIN1. Likewise, the p-type transistor 51d, the p-type transistor 51e, and the n-type transistor 51h, which act as, respectively, fourth, fifth, and sixth transistors, are connected together in series between the first power source VDD1 and the second input node XIN2.

A gate of the p-type transistor 51a is connected to both a drain of the p-type transistor 51d and a source of the p-type transistor 51e via a node N53, which acts as a first node. A gate of the p-type transistor 51d is connected to both a drain of the p-type transistor 51a and a source of the p-type transistor 51b via a node N54, which acts as a second node. The gates of the p-type transistors 51b and 51e and the n-type transistors 51g and 51h are connected to the second power source VBIAS.

The p-type transistor 51c, which acts as a seventh transistor, is connected between the node N54 and the second power source VBIAS, and its gate is connected to an intermediate node between the p-type transistor 51b and the n-type transistor 51g. The p-type transistor 51f, which acts as an eighth transistor, is connected between the node N53 and the second power source VBIAS, and its gate is connected to an intermediate node between the p-type transistor 51e and the n-type transistor 51h.

A signal at the node N53 is inverted via the output inverter 56 and then is output as the output signal XOUT that transits between the second potential VBIAS and the first potential VDD1. The node N54 is provided with a dummy inverter 57 having the same configuration as the output inverter 56 at a position corresponding to the output inverter 56.

The initial setting section 55 is a circuit that leads the node N53 to the high level and also leads the level shifter circuit device 5 to temporarily output a low-level signal via the output node XOUT, at an initial stage of the power source sequence.

The initial setting section 55 includes p-type transistors 55a and 55b, respectively, as ninth and tenth transistors, which are connected together in series between the first power source VDD1 and the node N54. Furthermore, the initial setting section 55 includes a p-type transistor 55c as an eleventh transistor, which is connected between the first power source VDD1 and the node N53, and the initial setting section 55 further includes a p-type transistors 55d as a twelfth transistor, which is connected between the first power source VDD1 and the node N53. A gate and drain of the p-type transistor 55a are connected together. A gate of the p-type transistor 55b is connected to a drain of the p-type transistor 55c, whereas a gate of the p-type transistor 55c is connected to a drain of the p-type transistor 55b. In short, p-type transistor 55b and the p-type transistor 55c are cross-coupled. A gate of the p-type transistor 55d is connected to the output node XOUT.

A description will be given of an operation of the initial setting section 55 in the power source sequence. In the following description, the first power source VDD1 is assumed to have risen earlier.

First, in an initial state of the power source sequence (the first potential VDD1=0 V and the second potential VBIAS=0 V), the potentials at the nodes N53 and N54 are set to 0 V.

When the first power source VDD1 rises, the potential at the node N53 also rises accordingly. The potential at the node N54 also rises, but this rising is delayed relative to that at the node N53 due to a step-down action of a threshold voltage Vt2 by the p-type transistor 55a diode-connected. As a result, the p-type transistor 55b is in a weak ON state as compared to the p-type transistor 55c, so that the potential at the node N53 becomes at the high level and the potential at the node N54 becomes at the low level. Furthermore, when the potential at N53 is at a high level, the output signal XOUT is at a low level, and thus the p-type transistor 55d is turned on. The p-type transistor 55d thereby acts to help the potential at the node N53 becomes at the high level. In the power source sequence, both the n-type transistors 51h and 51g are turned off over a period in which the second potential VBIAS is lower than the threshold voltage Vt1 of the n-type transistors 51h and 51g (the period when VBIAS<Vt1). Thus, the input to the converter 54 is cut off.

Following the above, when VBIAS>Vt1, both the n-type transistors 51h and 51g are turned on. Since the input XIN of the level shifter circuit device 5 is connected to the ground GND as described above, a drain of the n-type transistor 51h becomes at the low level, and the p-type transistor 51f is thereby turned on. As a result, the potential at the node N53, which is the output of the level shifter circuit 53, becomes the second potential VBIAS, or becomes at the low level. Therefore, a high-level signal, or the first potential VDD1, is output as the output signal XOUT of the level shifter circuit device 5.

The relationship of VBIAS>Vt1 is established during the regular operation. Therefore, the description in the previous paragraph can be regarded as that of the regular operation in which a high-level signal is input to the first input signal XIN1 of the level shifter circuit 53 and a low-level signal is input to the second input signal XIN2 of the level shifter circuit 53.

On the other hand, a description will be given of an operation in which a high-level signal is input to the level shifter circuit device 5 as the input XIN, namely, in which a low-level signal is input to the level shifter circuit 53 as the first input signal XIN1 and a high-level signal is input to the level shifter circuit 53 as the second input signal XIN2. In this case, a drain of the n-type transistor 51g becomes at the low level, and the p-type transistor 51c is thereby turned on, in the level shifter circuit 53. As a result, the potential at the node N54 equates with the second potential VBIAS, namely, becomes at the low level, and the potential at the node N53, which is the output of the level shifter circuit 53, becomes at the high level. Therefore, the level shifter circuit device 5 outputs a low-level signal, that is the second potential VBIAS, as the output signal XOUT.

The drive capacity of each transistor in the initial setting section 55 is set to be lower than that of each transistor in the converter 54. This makes it possible to ignore an influence of the initial setting section 55 during the regular operation of the level shifter circuit 53.

Figure 4A:
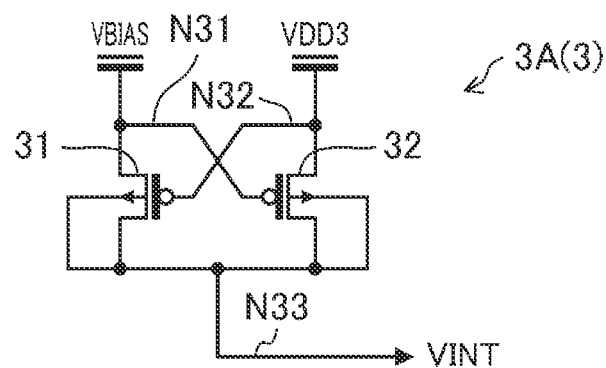
FIG. 4A is a circuit configuration diagram of a power source switch circuit.
Figure 4B:
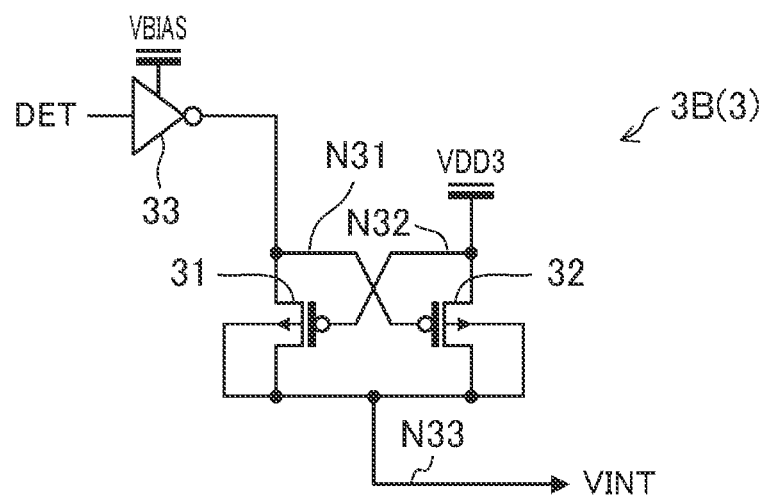
FIG. 4B is a circuit configuration diagram of another example of the power source switch circuit.
Figure 4C:
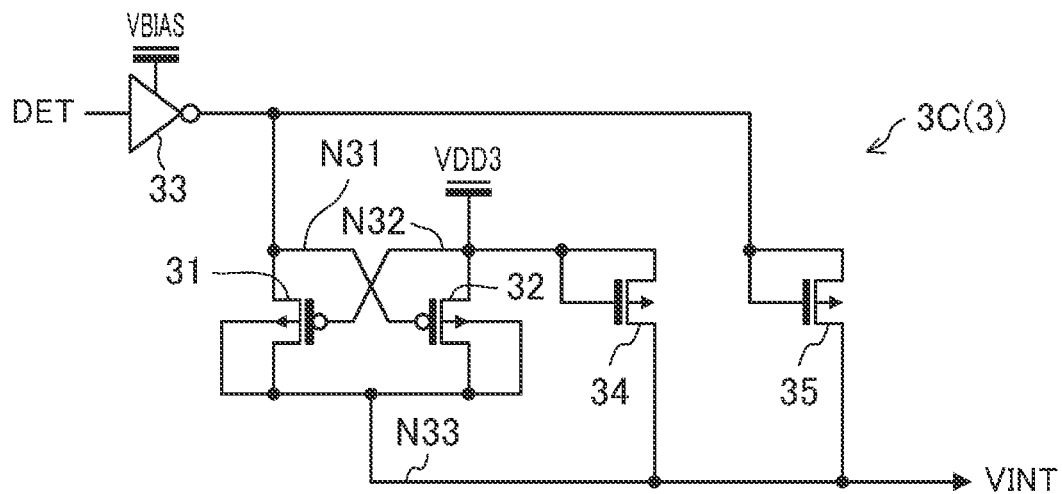
FIG. 4C is a circuit configuration diagram of still another example of a power source switch circuit.

FIG. 4A to 4C are configuration examples of the power source switch circuit 3.

A power source switch circuit 3A of FIG. 4A is a cross-coupling type of switch circuit, which includes: a p-type transistor 31 connected between the second power source VBIAS and the fourth power source VINT; and a p-type transistor 32 connected between the third power source VDD3 and the fourth power source VINT. The p-type transistor 31 acts as a third transistor, whereas the p-type transistor 32 acts as a fourth transistor.

In FIG. 4A, N31 is a symbol representing a connection node between the second power source VBIAS and the p-type transistor 31; N32 is a symbol representing a connection node between the third power source VDD3 and the p-type transistor 32; and N33 is a symbol representing connection node between the fourth power source VINT and each of the p-type transistors 31 and 32. A gate of the p-type transistor 31 is connected to the node N32, whereas a gate of the p-type transistor 32 is connected to the node N31.

Next, an operation of the power source switch circuit 3A will be described.

When only the first power source VDD1 has risen in the power source sequence, the third potential VDD3 becomes 0 V, so that the p-type transistor 31 is turned on and the p-type transistor 32 is turned off. As a result, the second potential VBIAS generated by the bias potential generation circuit is supplied from the second power source VBIAS as the fourth power source VINT.

During the regular operation, a relationship of the second potential VBIAS<the third potential VDD3 is established. Thus, the p-type transistor 31 is turned off, and the p-type transistor 32 is turned on. As a result, the third potential VDD3 is supplied from the third power source VDD3 as the fourth power source VINT.

In the power source switch circuit 3, as described above, the p-type transistors 31 and 32 have an exclusive relationship with each other. More specifically, no electricity conducts between the second power source VBIAS and the third power source VDD3. As a result, even when only the first power source VDD1 has risen earlier but the third power source VDD3 does not yet rise, no unnecessary current flows as opposed to the prior art.

The power source switch circuit 3B of FIG. 4B includes, in addition to the power source switch circuit 3A of FIG. 4A, an inverter 33 that receives the output DET of the power source detection circuit 6 and outputs the output DET as an inversion signal that transits between the ground GND and the second potential VBIAS. Furthermore, in the power source switch circuit 3B, the node N31 is connected to an output of the inverter 33 instead of the second power source VBIAS.

Next, an operation of the power source switch circuit 3B will be described.

When only the first power source VDD1 has risen in the power source sequence, the output DET of the power source detection circuit 6 becomes at the low level, and the potential at the node N31 becomes thereby the second potential VBIAS. Then, as in the case of the power source switch circuit 3A, the p-type transistor 31 is turned on, and the p-type transistor 32 is turned off. As a result, the second potential VBIAS is supplied from the second power source VBIAS as the fourth power source VINT.

During the regular operation, the output DET of the power source detection circuit 6 becomes at the high level, and the potential at the node N31 becomes thereby at the low level (ground potential GND). Then, the p-type transistor 31 is turned off, and the p-type transistor 32 is turned on. As a result, the third potential VDD3 is supplied from the third power source VDD3 as the fourth power source VINT.

In the power source switch circuit 3B, as described above, the ground potential GND is given to the gate of the p-type transistor 32, especially during the regular operation in which a load current from the fourth power source VINT increases. This makes it possible to enhance a current supply capacity of the fourth power source VINT as compared to the power source switch circuit 3A.

A power source switch circuit 3C of FIG. 4C includes, in addition to the power source switch circuit 3B of FIG. 4B, a diode clamp circuit 34 provided between the nodes N32 and N33 and a diode clamp circuit 35 provided between the nodes N31 and N33.

For example, when the first power source VDD1 has risen earlier, namely, when the third power source VDD3 starts rising after the second potential VBIAS is supplied to the node N31, the third potential VDD3 and the second potential VBIAS may temporarily have similar voltages. In this case, resistance values of the p-type transistors 31 and 32 increase, and a current supply capacity of the fourth power source VINT temporarily decreases, in which case the fourth potential VINT may temporarily become unstable.

By employing a configuration as in the power source switch circuit 3C, the second power source VBIAS or the third power source VDD3 supplies a current to the fourth power source VINT via at least one of the diode clamp circuit 34 or 35 when the fourth potential VINT temporarily decreases. This makes it possible to substantially prevent the fourth potential VINT from excessively decreasing.

In FIG. 4C, only one of the diode clamp circuits 34 and 35 may be provided, even in which case the same effect can be obtained.

Figure 5:
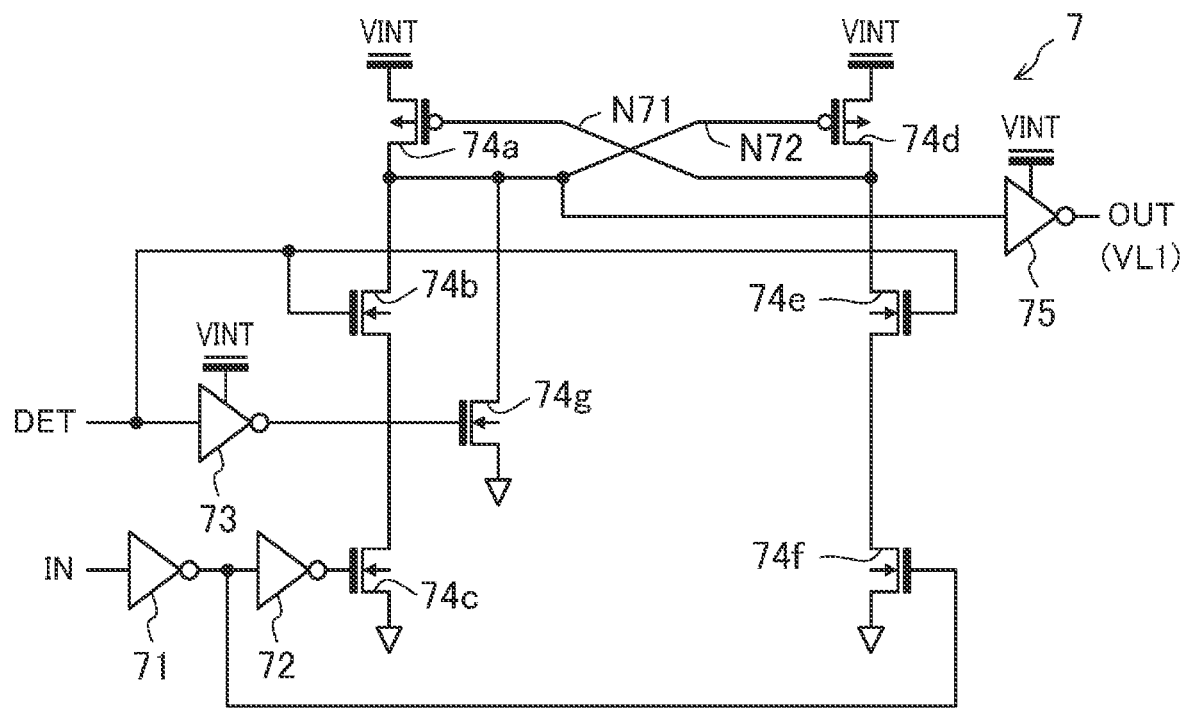
FIG. 5 is a circuit configuration diagram of a level shifter circuit.

FIG. 5 illustrates a configuration example of the level shifter circuit 7.

The level shifter circuit 7 of FIG. 5 is a cross-coupling type of level shifter circuit. In the level shifter circuit 7, a p-type transistor 74a and n-type transistors 74b and 74c are connected together in series in this order between the fourth power source VINT and the ground GND, and a p-type transistor 74d and n-type transistors 74e and 74f are connected together in series in this order between the fourth power supply VINT and ground GND.

An input signal IN is inverted via the inverter 71 and given to a gate of the n-type transistor 74f, and is also given to a gate of the n-type transistor 74c via the inverter 71 and an inverter 72.

A gate of the p-type transistor 74a is connected to a drain of the p-type transistor 74d via a node N71, whereas a gate of the p-type transistor 74d is connected to a drain of the p-type transistor 74a via a node N72. The node N72 is connected to a node VL1 via an inverter 75, which transits between the ground potential GND and the fourth potential VINT.

Gates of the n-type transistors 74b and 74e are connected to the output DET of the power source detection circuit 6. As a result, both the n-type transistors 74b and 74e are turned off when the output DET of the power source detection circuit 6 is at the low level, namely, in the power source sequence.

Connected between the node N72 and the ground GND is an n-type transistor 74g for initial value setting (pull-down). A gate of the n-type transistor 74g is connected to the output DET of the power source detection circuit 6 via an inverter 73, which transits between the ground potential GND and the fourth potential VINT. As a result, when the output DET of the power source detection circuit 6 is at the low level and the first power source VDD1 or the third power source VDD3 supplies a constant voltage, the n-type transistor 74g is turned on, so that the node N72 is pulled down and a high-level signal is output to node V L. When only the first power source VDD1 has risen, the high-level signal is output to the node VL1 and in response to this, the level shifter circuit device 4, which will be described later, outputs a high-level signal, thereby reliably turning off the p-type transistor 11.

A regular operation of the level shifter circuit 7 is the same as that of a generally known cross-coupling type of level shifter circuit and a detailed description thereof will be omitted.

Figure 6:
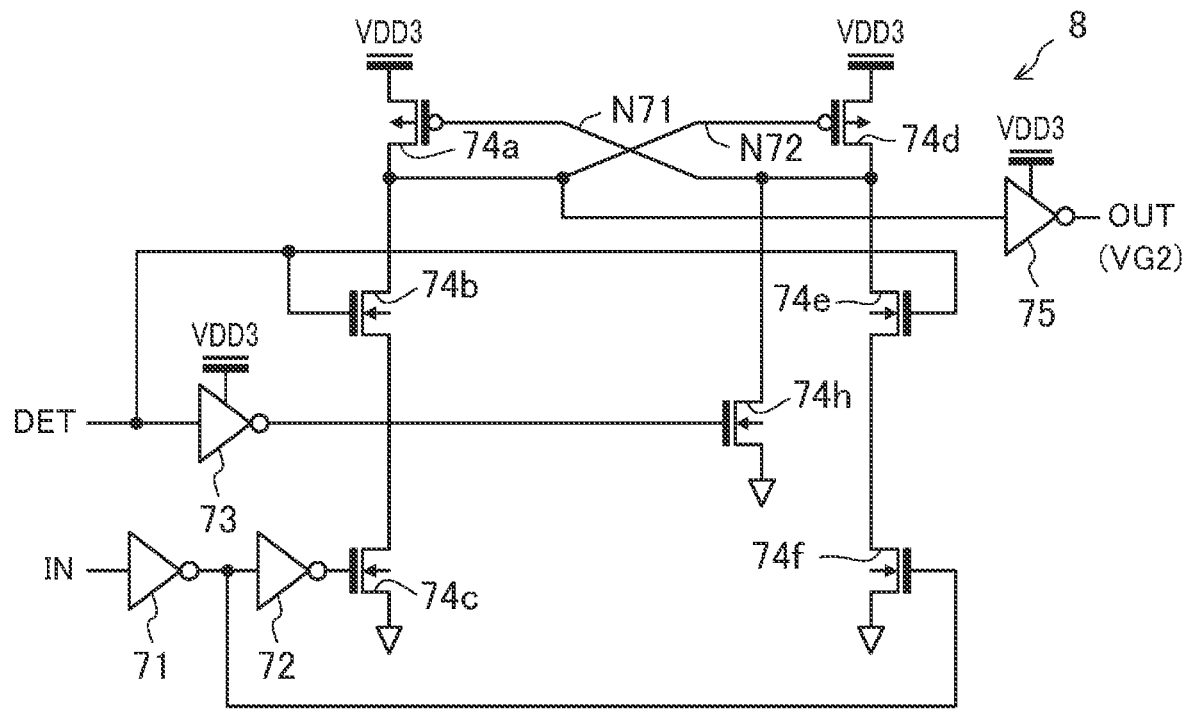
FIG. 6 is a circuit configuration diagram of a level shifter circuit.

FIG. 6 is a configuration example of the level shifter circuit 8.

The level shifter circuit 8 of FIG. 6 has basically a similar configuration to that of the level shifter circuit 7 but differs from the level shifter circuit 7 in a connection of the third power source VDD3 instead of the fourth power source VINT and a connection location of a pull-down transistor 74h.

More specifically, in the level shifter circuit 8, an n-type pull-down transistor 74h is connected between the node N71 and the ground GND. When the output DET of the power source detection circuit 6 is at the low level with the first power source VDD1 or the third power source VDD3 supplying a constant voltage, the level shifter circuit 8 outputs a low-level signal via a node VG2. This reliably turns off the n-type transistor 14.

Other configurations and operations are the same as those of the level shifter circuit 7, and thus detailed description thereof will be omitted.

Figure 7A:
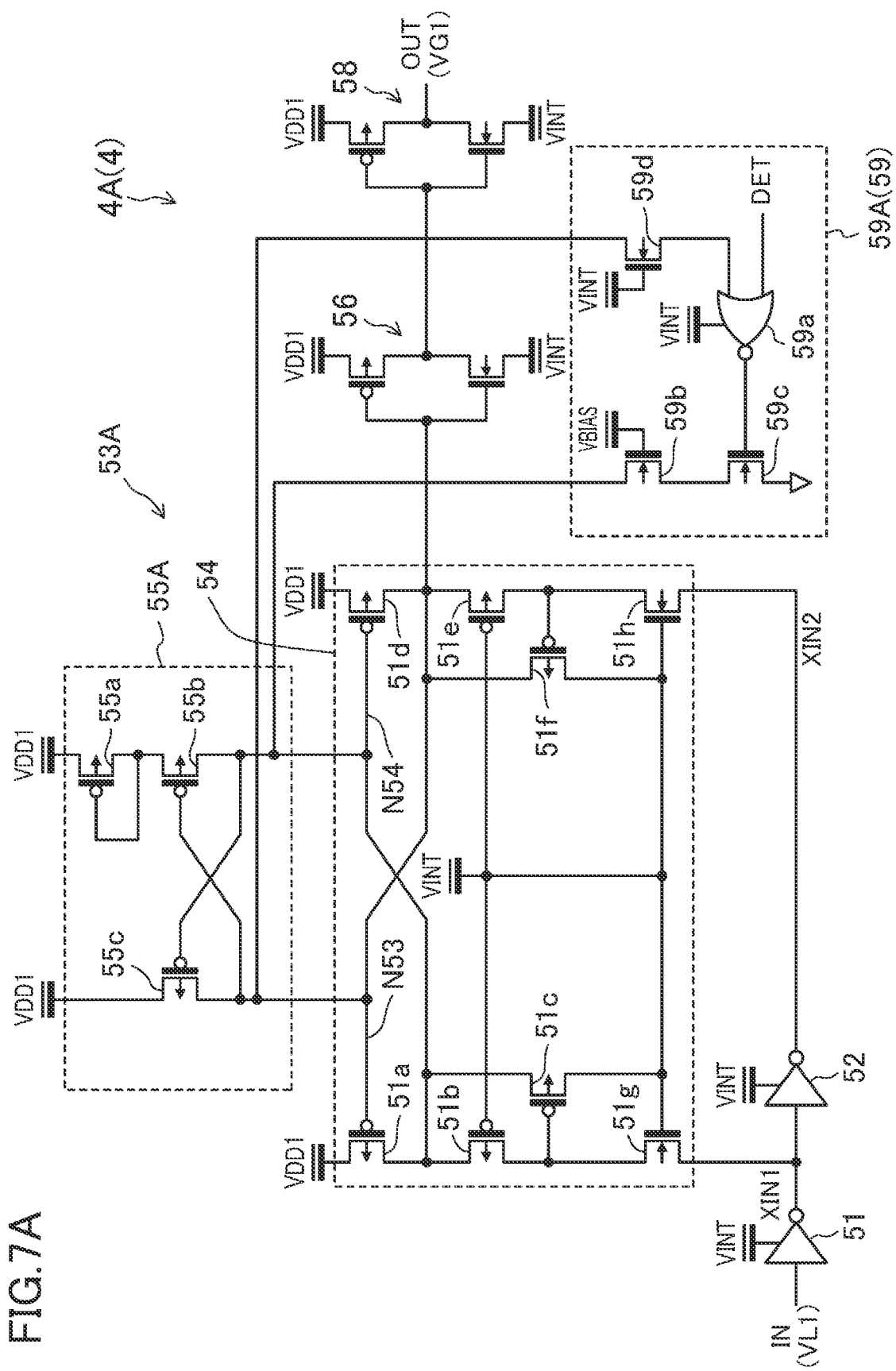
FIG. 7A is a circuit configuration diagram of a level shifter circuit device.
Figure 7B:
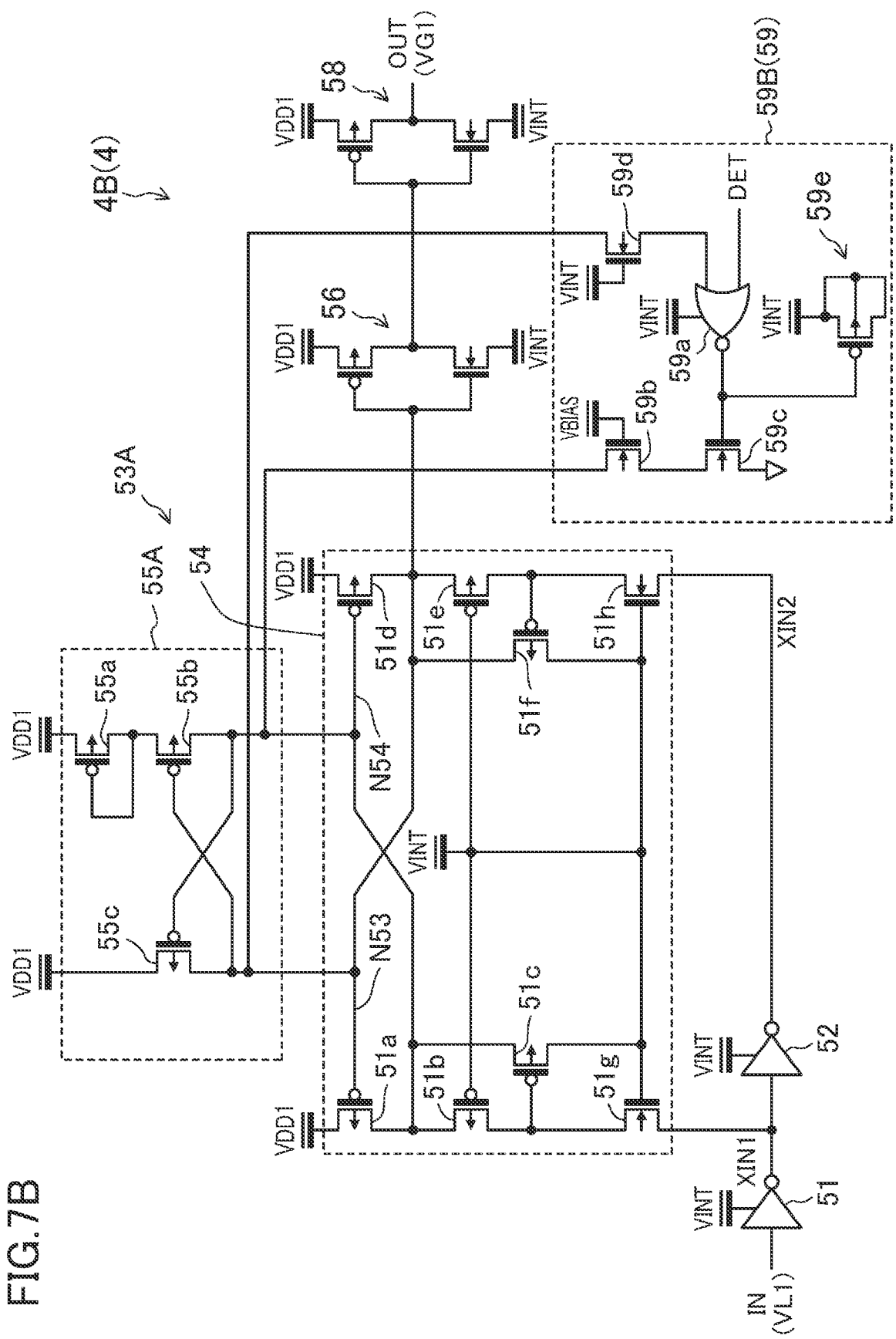
FIG. 7B is a circuit configuration diagram of another example of the level shifter circuit device.

FIGS. 7A and 7B are configuration examples of the level shifter circuit device 4.

A level shifter circuit device 4A of FIG. 7A includes: the first input inverter 51 and the second input inverter 52 connected together in series; a level shifter circuit 53A; and output inverters 56 and 58 connected between the first power source VDD1 and the fourth power source VINT. In FIG. 7A, components that are identical to those in the level shifter circuit device 5 (see FIG. 3C) are given the same reference numerals, and thus a description thereof may be omitted.

An operation of the level shifter circuit 53A is the same as or similar to as that of the level shifter circuit 53 in FIG. 3C. More specifically, during the regular operation, the level shifter circuit 53A has a function of converting a signal that transits between the ground potential GND and the fourth potential VINT into a signal that transits between the fourth potential VINT and the first potential VDD1.

The level shifter circuit 53A includes: the converter 54 having the same components as those of the level shifter circuit device 5; and an initial setting sections 55A and 59A each of which sets the output of the level shifter circuit 53 to a predetermined output, in the power source sequence.

The initial setting section 55A differs from the initial setting section 55 of FIG. 3C in that the p-type transistor 55d is not provided between the first power source VDD1 and the node N53. However, a function of the initial setting section 55A is the same as that of the initial setting section 55. More specifically, at the initial stage of the power source sequence, the potential at the node N53 is led to a high level, and the level shifter circuit device 4A is led to temporarily output a high-level signal via an output node OUT.

The initial setting section 59A includes a two-input NOR circuit 59a and an n-type transistor 59c, respectively, as a logic circuit and a ninth transistor.

One input of the NOR circuit 59a is connected to the node N53 via an n-type transistor 59d, which acts as a tenth transistor. The other input of the NOR circuit 59a is connected to the output DET of the power source detection circuit 6. A gate of the n-type transistor 59d is connected to the fourth power source VINT (equivalent to the second power source). The fourth power source VINT acts as a drive power source for the NOR circuit 59a.

Of the n-type transistor 59c, a drain is connected to the node N54 via an n-type transistor 59b, a source is connected to the ground GND, and a gate is connected to an output of the NOR circuit 59a; the n-type transistor 59b acts as an eleventh transistor, and the ground GND acts as the third power source. A gate of the n-type transistor 59b is connected to a second power source VBIAS (equivalent to a fourth power source).

An operation of the initial setting section 59A in the power source sequence will be described. In the following description, the first power source VDD1 is assumed to have risen earlier.

First, in the initial state of the power source sequence (first potential VDD1=0 V and second potential VBIAS=0 V), the output DET of the power source detection circuit 6 is set to 0 V, and both the inputs of the NOR circuits 59a are set to 0 V.

When the first power source VDD1 rises, the second potential VBIAS and the fourth potential VINT rise accordingly. Then, when the fourth potential VINT rises to a predetermined potential, the output of the NOR circuit 59a becomes at the high level, and the n-type transistor 59c is thereby turned on. In this case, the second potential VBIAS has already risen, and thus the n-type transistor 59b is turned on. As a result, the electricity conducts between the node N54 and the ground GND, so that the potential at the node N54 becomes at the low level and the potential at the node N53 becomes at the high level. A signal at the node N53 is output to a node VG1 via the two inverters 56 and 58, thereby more reliably turning off the p-type transistor 11.

When the signal at the node N53 reaches the high level, this signal is given to an input of the NOR circuit 59a via the n-type transistor 59d. Then, the output of the NOR circuit 59a becomes at the low level. In response, the n-type transistor 59c is turned off, and the connection between the node N54 and the ground GND is cut off. During the regular operation, the output DET of the power source detection circuit 6 becomes at the high level, and thus the output of NOR circuit 59a becomes at the low level, independently of states of node N53. As a result, the initial setting section 59A does not affect the regular operation.

As described above, using the initial setting sections 55A and 59A together can more reliably set an initial value in the power source sequence.

A level shifter circuit device 4B of FIG. 7B includes, in addition to the level shifter circuit device 4A of FIG. 7A, a capacitive element 59e provided between the output node of the NOR circuit 59a and the fourth power source VINT; the capacitive element 59e assists an initial value setting. With this configuration, the capacitive element 59e increases the potential at the output node of the NOR circuit 59a to the fourth potential VINT when the first power source VDD1 rises in the power source sequence. As a result, the amount of the current driven by the n-type transistor 59c increases, promptly and reliably causing the potential at the node N54 to transit to the initial value.

To summarize the above description, when the first power source VDD1 has risen earlier in the semiconductor integrated circuit device 100 of FIG. 1, the output DET of the power source detection circuit 6 becomes at the low level, and the second potential VBIAS of the second power source rises to ½ the first potential VDD1. Then, the power source switch circuit 3 operates to output the second potential VBIAS via the fourth power source VINT. In this case, as described above, no unnecessary current flows through the power source switch circuit 3 as opposed to the prior art.

In response to the rise of the first power source VDD1, both the level shifter circuit 7 and the level shifter circuit device 4, which are connected to the upstream-stage of the p-type transistor 11, promptly output high-level signals, thereby turning off the p-type transistor 11. This makes it possible to cut off the current flowing through the p-type transistor 11. In this case, the gate of the p-type transistor 12, which is connected to the fourth power source VINT, is given the second potential VBIAS.

In addition to the above, in response to the rise of the first power source VDD1, the level shifter in the level shifter circuit 8 connected to the upstream-stage of the n-type transistor 14 promptly outputs a low-level signal, thereby turning off the n-type transistor 14. This makes it possible to cut off the current flowing through the n-type transistor 14.

As described above, the semiconductor integrated circuit device 100 according to the present disclosure, even when only the first power source VDD1 has risen earlier, does not generate an unnecessary current and also does not cause a withstand voltage violation in transistors constituting the circuit. In addition, the output section 10 can have a high-impedance output, which can substantially prevent adverse effects on another device (not illustrated) connected to the output terminal 1.

Modification of First Embodiment

Figure 8:
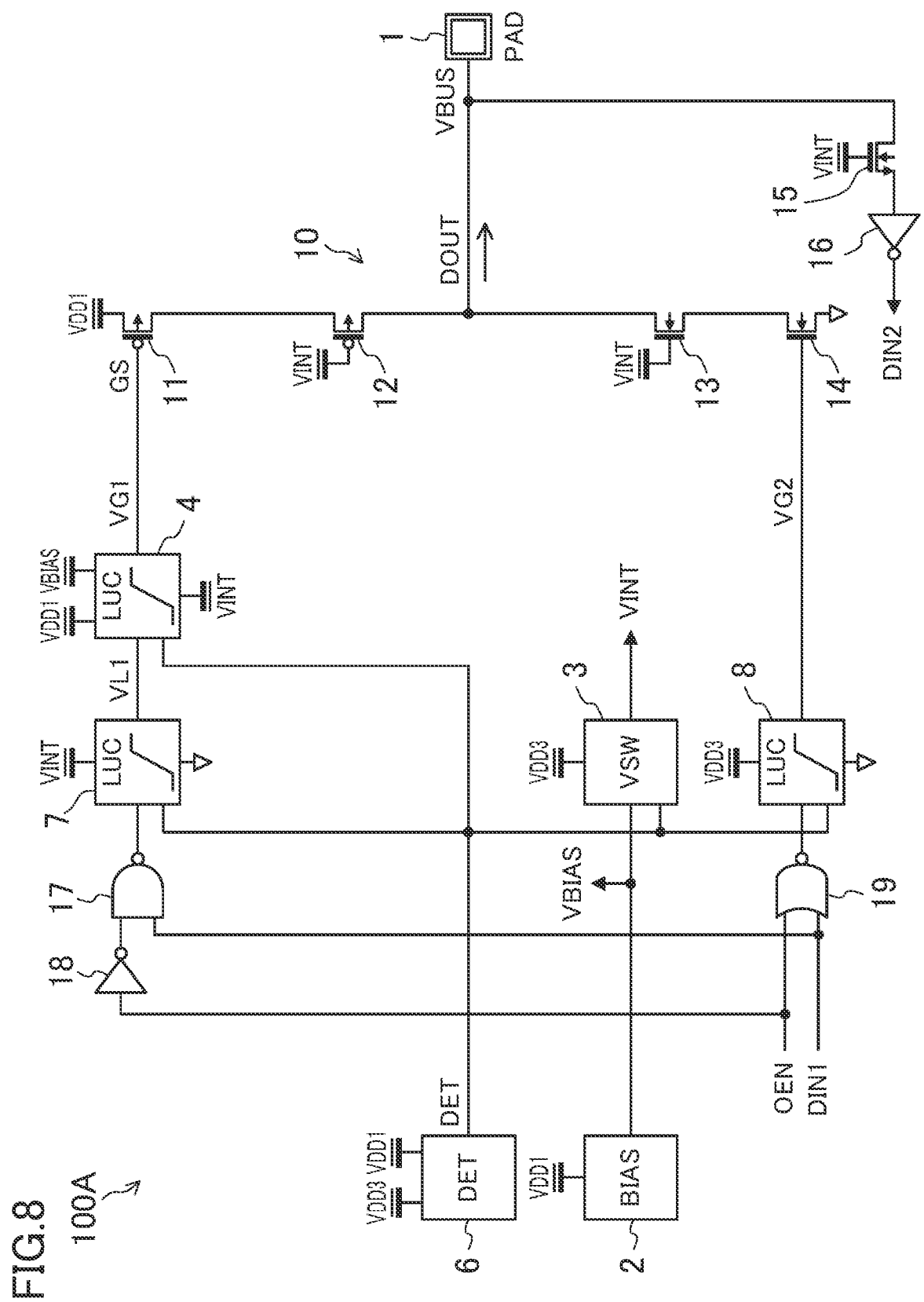
FIG. 8 is a circuit configuration diagram of another example of the semiconductor integrated circuit device according to the first embodiment.

FIG. 8 is another example of the circuit configuration diagram of the semiconductor integrated circuit device according to the first embodiment.

The semiconductor integrated circuit device 100A of FIG. 8 differs from the configuration of FIG. 1 in that the gates of the n-type transistors 13 and 15 are connected to the fourth power source VINT.

With the above configuration, even when another device to which the first power source VDD1 shared by the semiconductor integrated circuit device 100A is connected applies a signal of the first potential VDD1 to the output terminal 1, a withstand voltage violation can be substantially prevented because the fourth potential VINT is applied to the gates of the n-type transistor 13 and 15.

A detailed description of the other configurations and operations will be omitted because they are the same as those described above.

Second Embodiment

Figure 9:
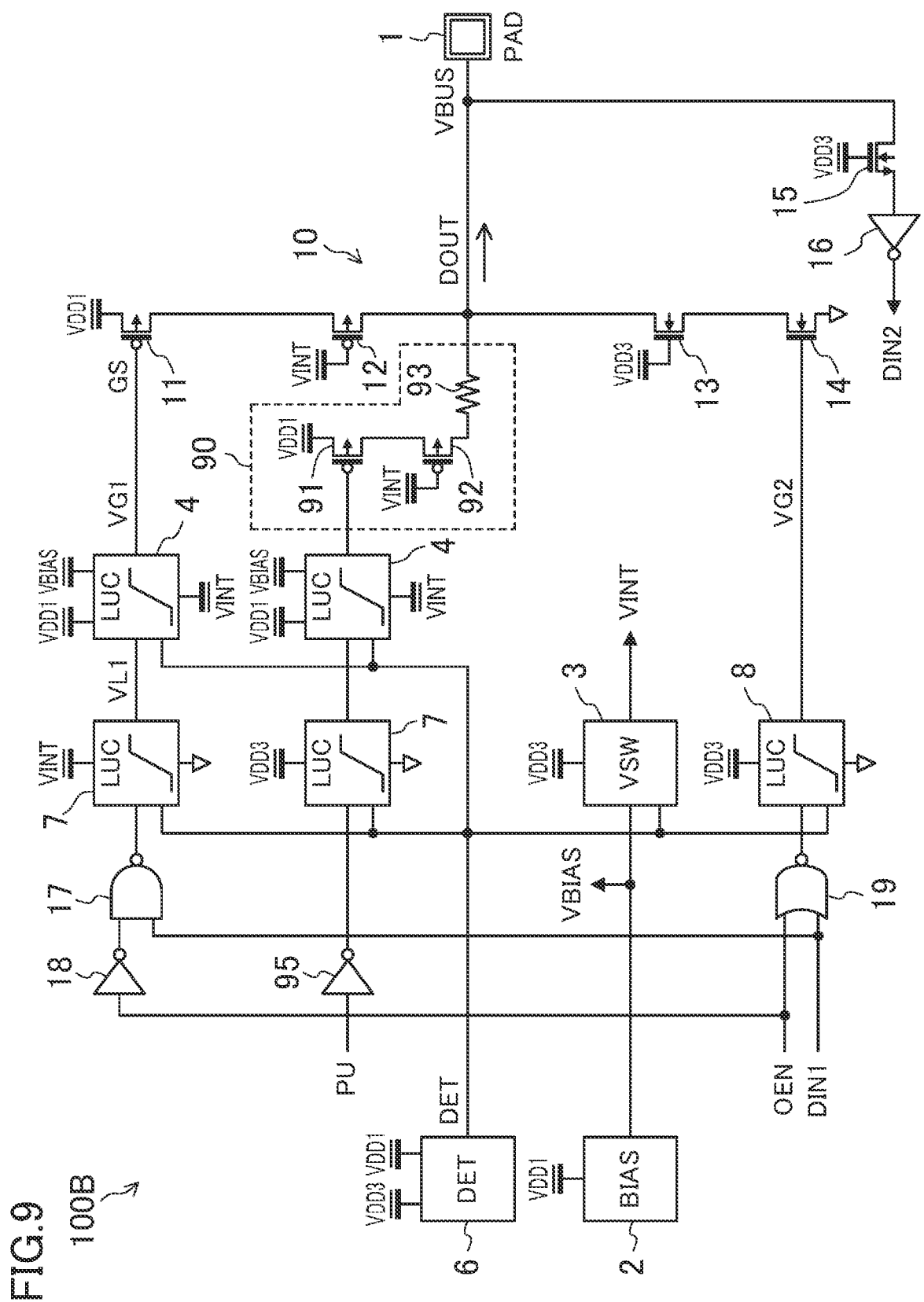
FIG. 9 is a circuit configuration diagram of a semiconductor integrated circuit device according to a second embodiment.

FIG. 9 is a circuit configuration diagram of a semiconductor integrated circuit device according to a second embodiment.

A semiconductor integrated circuit device 100B of FIG. 9 differs from the configuration of FIG. 1 in including a pull-up function at an output terminal 1. This pull-up function refers to a function of outputting a high-level signal via a pull-up resistor when an output impedance at the output terminal 1 is high. The following description will be centered on differences from the first embodiment. In FIG. 9, the components that are identical to those in FIG. 1 are given the same reference numerals, and the description thereof may be omitted.

As illustrated in FIG. 9, the semiconductor integrated circuit device 100B includes a pull-up circuit 90 formed of p-type transistors 91 and 92 and a pull-up resistor 93, all of which are connected together in series in this order between a first power source VDD1 and the output terminal 1.

The semiconductor integrated circuit device 100B further includes: a level shifter circuit 7 that receives a pull-up signal PU via an inverter 95; and a level shifter circuit device 4 that drives a gate of a p-type transistor.

The level shifter circuit 7 converts an input signal IN that transits between a ground potential GND and a voltage level (e.g., 0.9 V) of a core power source into an output signal OUT that transits between the ground potential GND and a third potential VDD3 and then outputs the output signal OUT to the level shifter circuit device 4.

The level shifter circuit device 4 receives both an output DET of the power source detection circuit 6 and an output VL1 of the level shifter circuit 7 and then outputs a signal that transits between a fourth potential VINT and the first potential VDD1 to a gate of the p-type transistor 91.

A gate of the p-type transistor 92 is connected to the fourth power source VINT.

Circuit configurations of the level shifter circuit 7 and the level shifter circuit device 4 are the same as those described above, and a detailed description thereof will be omitted.

An operation of the semiconductor integrated circuit device 100B will be described.

When the pull-up signal PU is at the high level during the regular operation, outputs of the level shifter circuit 7 and the level shifter circuit device 4 in the semiconductor integrated circuit device 100B become at the low level. Both the p-type transistors 91 and 92 are thereby turned on to feed a current from the first power source VDD1 to the output terminal 1 via the pull-up resistor 93, thereby pulling up the output terminal 1. When an output of the semiconductor integrated circuit device 100B is at the low level, a capability of n-type transistors 13 and 14 to perform pull-down operation is greater than that of the pull-up resistor 93 to perform pull-up operation, and thus the output terminal becomes at the low level.

When the pull-up signal PU is at the high level in the power source sequence, gates of the p-type transistors 11 and 12 are connected to the same circuits as those to which the gates of the p-type transistors 91 and 92 are connected. Therefore, the p-type transistors 91 and 92 operate in the same manner as the p-type transistors 11 and 12 in the foregoing first embodiment. In short, the p-type transistor 91 in the pull-up circuit 90 is promptly and reliably turned off, able to set the output in a high impedance state without causing a withstand voltage violation. This makes it possible to substantially prevent adverse effects on another device (not illustrated) connected to the output terminal 1.

The present disclosure is not limited to the configurations in the foregoing embodiments. In addition, one or more other novel embodiments may be conceived by combining components described in the foregoing embodiments without departing from the spirit of the present disclosure.

The present disclosure is highly effective in providing a semiconductor integrated circuit device that, even if a high-voltage power source has risen earlier than a low-voltage power source, does not cause a withstand voltage violation and also does not cause an unnecessary current to flow.

What is claimed is:

1. A semiconductor integrated circuit device that receives a data input signal and outputs an output signal that varies in accordance with the data input signal, the semiconductor integrated circuit device comprising:
an output terminal via which the output signal is output;
a first transistor of a p type having a source connected to
a first power source;

a second transistor of a p type having a source connected to a drain of the first transistor and a drain connected to the output terminal;

a step-down circuit that generates a second power source from the first power source;

a power source switch circuit that outputs, as a fourth power source, a higher one of potentials of the second power source and a third power source, the power source switch circuit including a third transistor connected to the second power source and a fourth transistor connected to the third power source; and a first level shifter circuit that transits between the first power source and the fourth power source, the first transistor having a gate connected to an output of the level shifter circuit, the second transistor having a gate connected to the fourth power source.

2. The semiconductor integrated circuit device of claim 1, further comprising a fifth transistor of an n type provided between the output terminal and a fifth power source, the fifth transistor having a gate connected to the fourth power source.

3. The semiconductor integrated circuit device of claim 1, further comprising a sixth transistor of an n type having one end connected to the output terminal and a gate connected to the fourth power source.

4. The semiconductor integrated circuit device of claim 1, further comprising a seventh transistor of a p type having a source connected to the first power source;

a pull-up resistor provided between a drain of the seventh transistor and the output terminal; and a second level shifter circuit that gives, to a gate of the seventh transistor, a signal that transits between the first power source and the fourth power source.

* * * * *